United States Patent
Van Dijk et al.

(10) Patent No.: US 11,641,843 B2
(45) Date of Patent: May 9, 2023

(54) ENERGY-SAVING LABEL FOR ATTACHMENT TO AN ANIMAL

(71) Applicant: Nedap N.V., Groenlo (NL)

(72) Inventors: Jeroen Martin Van Dijk, Enschede (NL); Jan Cornelis Stekelenburg, Varsseveld (NL)

(73) Assignee: Nedap N.V., Groenlo (NL)

( * ) Notice: Subject to any disclaimer, the term of this patent is extended or adjusted under 35 U.S.C. 154(b) by 61 days.

(21) Appl. No.: 17/139,098

(22) Filed: Dec. 31, 2020

(65) Prior Publication Data

US 2021/0204514 A1 Jul. 8, 2021

(30) Foreign Application Priority Data

Jan. 3, 2020 (NL) ..................................... 2024604

(51) Int. Cl.
*A01K 11/00* (2006.01)
*H02J 7/34* (2006.01)
*H03B 5/12* (2006.01)

(52) U.S. Cl.
CPC ............ *A01K 11/006* (2013.01); *H02J 7/345* (2013.01); *H03B 5/1228* (2013.01); *H02J 2207/50* (2020.01)

(58) Field of Classification Search
CPC .................................................... A01K 11/006
USPC ...................................................... 340/573.1
See application file for complete search history.

(56) References Cited

U.S. PATENT DOCUMENTS

| | | | |
|---|---|---|---|
| 5,559,478 A * | 9/1996 | Athas | H02M 7/5383 |
| | | | 307/108 |
| 6,229,406 B1 * | 5/2001 | Wang | H03B 5/1212 |
| | | | 331/46 |
| 2008/0129399 A1 * | 6/2008 | Jang | H03B 19/14 |
| | | | 331/117 FE |
| 2021/0020012 A1 * | 1/2021 | Shakedd | G06K 19/0726 |

FOREIGN PATENT DOCUMENTS

WO   WO 2019/009717 A1   1/2019

OTHER PUBLICATIONS

European Patent Office, Dutch Search Report and Written Opinion in corresponding Netherlands Application No. 2024604, dated Jan. 3, 2020 (9 pages).

* cited by examiner

*Primary Examiner* — Joseph Chang
(74) *Attorney, Agent, or Firm* — Leydig, Voit & Mayer, Ltd.

(57) ABSTRACT

A label is described for attachment to an animal. The label includes a transmitting and receiving device having an electric oscillator circuit that, upon closure of the oscillator circuit, generates a periodic electric oscillator signal with an oscillation period for transmitting an electromagnetic beacon signal with the transmitting and receiving device. The label is configured for closing the electric oscillator circuit during a predetermined transmission duration, and is further configured for opening the electric oscillator circuit upon elapse of the predetermined transmission duration, wherein the predetermined transmission duration corresponds to at least one and at least a whole number of oscillation periods of the electric oscillator signal.

21 Claims, 2 Drawing Sheets ured to an animal. In particular, the invention relates to a label for
ENERGY-SAVING LABEL FOR ATTACHMENT TO AN ANIMAL

CROSS-REFERENCE TO RELATED APPLICATIONS

This patent application claims priority to Netherlands Application No. 2024604, filed Jan. 3, 2020, the contents of which are expressly incorporated by reference in their entirety, including any references contained therein.

FIELD AND BACKGROUND OF THE INVENTION

The present invention relates to a label for attachment to an animal. In particular, the invention relates to a label for attachment to an animal, which label is provided with a transmitting and receiving device comprising an electric oscillator circuit which oscillator circuit is configured for, upon closure of the oscillator circuit, generating a periodic electric oscillator signal with an oscillation period for transmitting an electromagnetic beacon signal with the transmitting and receiving device. Further, the present invention relates to a system of a plurality of labels.

Such labels are used for, among other purposes, the position determination, also: positioning, of the label in a space. In particular, such labels are for example used in livestock farming for the positioning of an animal provided with such a label, for example in a barn. Through transmission of a beacon signal by the label, a position of that label can be determined with respect to one or more receivers of the beacon signal.

To be suitable for attachment to an animal, the known labels are provided with a wearable energy source. However, for application of such labels, in particular within livestock farming, the transmitted power of the beacon signal should be sufficiently great to be receivable over a relatively great distance. For this, a relatively large supply power is needed, which has as a consequence that the supply source should be made of relatively sizeable design with respect to the rest of the label and with respect to the animal, which adversely affects the wearability of the label. On the other hand, given a limited size of the energy source, the useful life of the label is relatively short and it is necessary to recharge or replace the label regularly.

It is therefore an object of the present invention to obviate the disadvantages of the prior art and to provide an energy-saving label for attachment to an animal.

SUMMARY OF THE INVENTION

To this end, the invention provides, according to a first aspect thereof, a label for attachment to an animal, characterized in that the label is configured for closing the electric oscillator circuit during a predetermined transmission duration, and is configured for opening the electric oscillator circuit upon lapse of the predetermined transmission duration, wherein the predetermined transmission duration corresponds to at least one and at least a whole number of oscillation periods of the electric oscillator signal for preserving electric energy in the oscillator circuit. The oscillator circuit is opened after elapse of at least a whole number of oscillation periods. For example, the predetermined transmission duration should correspond to k oscillation periods, where k is a whole number greater than zero. Upon closure of the oscillator circuit, a periodic electric oscillator signal is generated with a particular oscillation frequency, wherein the oscillation frequency is determined by the electric components and the mutual switching therebetween in the oscillator circuit. In particular, the oscillation frequency corresponds to an eigenfrequency, natural frequency or resonance frequency of the circuit. The oscillator signal may for instance be induced by electric potential energy stored in the oscillator circuit, wherein, upon closure of the oscillator circuit, an exchange takes place between a first and second energy storage mode of the potential electric energy. The electric oscillator signal involves a periodic signal of an electrical quantity at one or more locations in the oscillator circuit measured in time, such as voltage, current intensity, electric energy, power, electric potential, electrical field strength, magnetic field strength, etc., as a function of time. The oscillation period of the oscillator signal corresponds to the oscillation frequency of the circuit, and may be built up from self-repeating oscillation periods. By opening the electric oscillator circuit at a time when at least one and at least a whole number of oscillation periods have elapsed since closure of the oscillator circuit, the oscillator signal is at least substantially back in the initial state. As a result, a largest possible part of the electric energy of the oscillator circuit can caught and preserved in the oscillator circuit and as little energy as possible is dissipated in the electric oscillator circuit as a result of the opening of the circuit. A part of the electric energy in the oscillator circuit, however, can be consumed for producing the beacon signal, and a part of the electric energy will then be dissipated in the oscillator circuit as a result of losses such as an internal electrical resistance of the circuit. The difference in electric potential energy in the oscillator circuit between the initial state prior to closure of the circuit, and the final state after opening of the circuit, is therefore solely due to the consumed energy and losses in the circuit. In other words, energy can be saved in the label by opening the oscillator circuit upon elapse of at least one and at least a whole number of oscillation periods of the electric oscillator signal. The preserved electric energy can then be used, for example, for transmitting a beacon signal at a later time.

In an embodiment of the label, the oscillator circuit comprises an LC circuit with at least a capacitor and a coil, wherein, upon closure of the oscillator circuit, the capacitor is discharged for producing the periodic electric oscillator signal. The capacitor and coil are connected such that, upon closure of the oscillator circuit, an exchange takes place between electric field energy in the capacitor and magnetic field energy in the coil. More specifically, in an initial state of the oscillator circuit, electric energy is stored in the oscillator circuit in an electric field between capacitor plates of the capacitor, whereupon, after closure of the oscillator circuit, the capacitor and the coil are connected to each other so that the capacitor is discharged and, as a result, a current starts to flow through the coil. The current through the coil thereby generates a magnetic field. In this manner, the electric field energy (in the capacitor) is hence converted to magnetic field energy in the coil. Through self-induction as a result of the magnetic field, the coil counteracts any current change. After the capacitor has discharged, and the voltage across the capacitor plates is nil, therefore, as a result of the magnetic field in the coil, a current will flow back to the capacitor, as a result of which the capacitor is recharged with a voltage of opposite polarity to the one before. After the magnetic field around the coil is exhausted, and the electric energy in the oscillator circuit is once again stored in electric field energy in the capacitor, the above-described process will repeat itself in the opposite direction, whereby the capacitor once again discharges, and via a magnetic field around the coil is charged again, as a result of which the capacitor is at least substantially back in the initial state. An oscillation period is thus defined herein as the above-described cycle. Such an oscillation period can repeat itself several times to thereby prolong the transmission duration of the label. During the oscillating of the oscillator circuit of the label, the beacon signal is produced on the basis of which a position of the label can be determined. Breaking off the production of the beacon signal can be brought about by opening the oscillator circuit; however, when the circuit is opened at the time when, after discharge of the capacitor, the capacitor has been recharged to the maximum again by the coil, as much electric energy as possible can be stored and preserved in the oscillator circuit. In particular, the LC circuit is an electric resonator whereby, upon closure of the oscillator circuit, an electric resonance signal is generated with a particular eigenfrequency, natural frequency or resonance frequency.

In a further embodiment, the label is provided with a supply source, such as a button cell battery, for charging the capacitor. During oscillating, electric energy will be consumed for producing the beacon signal and also a part will be dissipated by an internal resistance of the oscillator circuit. By tuning the transmission duration to the oscillation period of the oscillator circuit, a maximum amount of electric energy will be preserved in the oscillator circuit in the form of electric field energy in the capacitor. As a consequence, the capacitor only needs to be recharged by an amount equal to the part that has been dissipated and consumed in the circuit. For this, a supply source of a small size with respect to the label and with respect to the animal can be used, which improves wearability and wearing comfort of the label. Preferably, the supply source comprises a battery that is wearable by a livestock animal. In particular, the supply source comprises a button cell battery. The supply source can supply, for example, a direct current of about 1-20 volts, preferably about 5-15 volts, as, for example, 10 volts.

The oscillator circuit of the label can be closed and opened by means of a switch. In embodiments of the label, the electric oscillator circuit comprises a transistor for opening and closing the electric oscillator circuit. For this, advantageously, a field-effect transistor can be used, but the invention is not limited thereto. A field-effect transistor, typically referred to by its abbreviation FET, comprises a conducting channel between a first terminal and a second terminal, whereby conduction between the first and second terminal can be influenced by an electric field resulting from a voltage on a gate of the field-effect transistor. In an open state of the oscillator circuit, an electrical resistance between the first and second terminal is so high that practically no current can flow between the first and second terminal. In a closed state of the oscillator circuit, the electrical resistance between the first and second terminal is so low that a current can start to flow between the first and second terminal. A voltage can for instance be applied to the gate, as a result of which the electrical resistance between the first and second terminal becomes so low that a current can start to flow between the first and second terminal, as a result of which the oscillator circuit is closed and the oscillator signal is generated for producing the beacon signal. Failing a voltage on the gate, the resistance between the first and second terminal of the field-effect transistor will be so high that substantially no current can run between the first and second terminal and the oscillator circuit is consequently open. In this open state, no beacon signal is produced by the label, the label can then, for instance, function as a receiver. With a field-effect transistor, opening and closing of the oscillator circuit can be accurately timed. In addition, field-effect transistors are energy-efficient, as a result of which losses in the oscillator circuit can be limited. Especially the opening and closing of the gate can be effected with low voltages, and the electric conductivity between the terminals can be set sufficiently high (for example an electrical resistance of at most 1 mΩ) and sufficiently low to limit losses to a minimum. The skilled person will appreciate that in alternative embodiments use can also be made of different type transistors, for example, a bipolar transistor such as an NPN-type bipolar transistor with a sufficiently high amplification factor.

In an embodiment, the label is configured for receiving a synchronization signal with the transmitting and receiving device, the label being configured for closing the electric oscillator circuit upon reception of the synchronization signal. The gate of the field-effect transistor may for instance be connected with the transmitting and receiving device such that the synchronization signal can energize the gate of the field-effect transistor. For instance, a voltage may be applied to the gate of the field-effect transistor when the synchronization signal is received by the transmitting and receiving device. An amplifier may for instance be provided in the label to amplify a received synchronization signal, especially when the synchronization signal is too weak to energize the gate when it is received over a great distance. The transmission duration of the label may for instance be monitored with an internal clock of the transmitting label, whereby upon elapse of the predetermined transmission duration, the circuit is automatically opened. In an alternative embodiment, the duration of the closure of the oscillator circuit of the label is determined by the duration of the synchronization signal. The synchronization signal can be transmitted by a dedicated transmitter, but it is also possible that one or more labels are configured to produce the synchronization signal, for instance, upon request of a neighboring label.

In some embodiments, the label is configured for opening the electric oscillator circuit upon non-reception of the synchronization signal. In this way, the oscillator circuit can be opened by means of the synchronization signal upon elapse of the predetermined transmission duration of at least one and at least a whole number of oscillation periods of the electric oscillator signal. The duration of the synchronization signal thereby determines the length of time that the oscillator circuit is closed. In other words, the synchronization signal controls the transmission duration of the label. The synchronization signal is preferably an externally generated electromagnetic signal, so that no additional components are necessary for monitoring the transmission duration of the label.

The synchronization signal can comprise electromagnetic signals with frequencies in the Very High (VHF) and/or Ultra High Frequency (UHF) band, for example 900 MHz. While electromagnetic signals in this frequency band are sensitive to interferences such as reflections and diffractions from objects, they have a favorable transmission range for use within the livestock farm. For example, at a frequency of 900 MHz, the synchronization signal has a reach of about 100-1,000 meters. Thus, one or more labels present within a radius of 100-1,000 meters from the transmitter of the synchronization signal can be reached by the synchronization signal. A label may thus be configured for receiving with the transmitting and receiving device of the label an electromagnetic synchronization signal in the VHF or UHF range, such as an electromagnetic signal of about 900 MHz. The label may also be configured to produce such a synchronization signal.

In an embodiment of the label, the electric oscillator circuit is configured for, upon closure of the oscillator circuit, generating a periodic electric oscillator signal with an oscillation frequency of less than 1,000 kHz, preferably less than 500 kHz, for example about 400 kHz. The electric oscillator signal in the oscillator circuit of the label can produce an electromagnetic signal with a corresponding frequency. Thus, the transmitting and receiving device of the label may be configured for transmitting and receiving electromagnetic beacon signals with a frequency of less than 1,000 kHz, preferably less than 500 kHz, for example about 400 kHz. At these frequencies, the transmitted signals are not, or hardly so, hindered by reflections and/or unpredictable damping. Position determination (also: positioning) based on this signal can therefore be done relatively accurately, for example on the basis of a reception strength of a signal. Also, the transmission range of signals at these frequencies is favorable for application in labels that are worn by livestock in the livestock farm. For example, at a frequency of about 400 kHz, the beacon signal has a reach of about 10 meters, which is sufficient, for instance, to bridge in a barn the mutual distances between livestock animals or the distance to a fixed receiver. In this way, for instance, the mutual distances between multiple labels can be accurately established, or data such as sensor data from the labels can be exchanged.

According to some embodiments of the label, the electric oscillator circuit is configured for, upon closure of the oscillator circuit, generating a periodic electric oscillator signal with an oscillation frequency of less than 100 kHz, preferably about 50 kHz. At these oscillation frequencies, the transmitting and receiving device of the label may be configured for transmitting and receiving electromagnetic signals with a frequency of less than 100 kHz, for example with a frequency of about 50 kHz. While a drawback of these frequencies is the limited transmission range, this is made up for in that multiple labels can mutually pass on position information of each other. In this way, still, position information of all labels can be collected.

In an embodiment of the label, the electric oscillator circuit is configured for, upon closure of the oscillator circuit, generating a periodic electric oscillator signal with an oscillation frequency in the VHF or UHF range. At these oscillation frequencies, the transmitting and receiving device of the label may be configured for transmitting and receiving electromagnetic signals with a frequency in the VHF or UHF range. Such high oscillation frequencies in the oscillator circuit are possible, given a synchronization signal of sufficiently high frequency and given suitable conditions as in an environment with few visible obstacles.

In a further embodiment of the label, the predetermined transmission duration corresponds to 2-6 oscillation periods, preferably 3-5 oscillation periods, and more preferably 4 oscillation periods. The transmission duration is preferably as short as possible in order to consume as little energy as possible. However, in order to transmit sufficient information, it is desired to traverse 2-6, preferably 3-5, and more preferably 4 oscillation periods of the oscillator circuit. Given an oscillation frequency between 100-1,000 kHz and 2-6 oscillation periods, the predetermined transmission duration of the label is between 2-60 microseconds, in which sufficient information can be transmitted while transmission duration remains limited. Given an oscillation frequency of about 400 kHz and given a transmission duration corresponding to 4 oscillation periods, the label transmits a beacon signal during about 10 microseconds.

In an embodiment, the label is configured for transmitting with the transmitting and receiving device an electromagnetic beacon signal which comprises an identification code of the respective label. In this way, a receiver can establish what label the beacon signal originates from. This is particularly advantageous in systems in which the position of multiple labels is to be determined.

In a further embodiment, the label is configured for receiving with the transmitting and receiving device an electromagnetic beacon signal which has been transmitted by another label. In this way, multiple labels can determine their position relative to each other. For example, a mutual distance can be established between two individual labels. Optionally, a label may for example be arranged in a fixed position known beforehand, to thus form a reference point in a system in which multiple labels are active. Together with additional information, for example originating from a fixedly disposed receiver, the position of a label can be accurately established.

In further embodiments, the label is configured for, with the aid of a processor of the label, determining position determination data (also: positioning data). These embodiments make it possible to determine the position of a label on the basis of signal attenuation of the received beacon signal. Because the beacon signal is transmitted from the source—the transmitting label—omnidirectionally, the transmitted power decreases as the square of the distance from the source. When the initial strength of the signal is known, the signal attenuation can be calculated on the basis of the reception strength, and hence also the distance to the source—the transmitting label—can be determined. By combining the positioning data as determined by three (or more) receiving labels, the distance of the transmitting label to each of the receiving labels is known, and the position of the transmitting label can be determined. In addition, these embodiments make it possible to determine the position of the labels on the basis of time of flight of the received beacon signals. When the exact time of transmission of the signal is known, it can be determined from the exact reception time of different receiving labels what the distance of each of those labels to the transmitting label is. In some embodiments, the time-of-flight data as described above can be combined with the signal strength data as described in preceding embodiments, for augmenting the accuracy of positioning. In some of the above-mentioned embodiments, each label is provided with a clock to determine when a label transmits the beacon signal. This data can then be sent along with the beacon signal to be processed by receiving labels or, in an alternative embodiment, be sent to a receiver directly so that this data can be processed on an external computer. The positioning data determined with the aid of the processor of the label can be transmitted to a central receiver which is communicatively connected with the computer. The central receiver may be configured to receive positioning data of multiple labels, while the computer is configured for, on the basis of the received information, determining relative positions of the labels with respect to each other.

According to some embodiments, the label is configured to transmit with the transmitting and receiving device information about the positioning data determined by a processor of that label and the associated identification code. Such data of a plurality of labels can then be collected by a receiver which is coupled with a computer, in order to determine, on the basis of the received relative distances between a plurality of labels, the absolute positions of the labels.

According to a second aspect of the present invention, there is provided a system comprising a plurality of labels according to the first aspect of the invention, wherein each label is configured for receiving with the transmitting and receiving device an electromagnetic beacon signal which has been transmitted by another label, which electromagnetic beacon signal comprises an identification code of the respective label, and wherein each label is configured to determine positioning data with the aid of a processor of the label, and wherein each label is configured to transmit with the transmitting and receiving device information about the positioning data determined by the processor of that label and the associated identification code, wherein the system further comprises at least a receiver for receiving the information about the positioning data transmitted by the labels and the associated identification codes, and a computer which is communicatively connected with the receiver and which is configured to calculate, at least on the basis of information about the positioning data received with the receiver and the associated identification codes, the relative positions of the labels relative to each other and to export information about the relative positions of the labels together with the associated identification codes of the labels, in particular in the form of an electrical information signal.

The mutual relative position of each transmitting label can be determined in the system from the positioning data as generated by three or more receiving labels. It provides advantages, however, to do positioning on the basis of a larger number of receiving labels, and the system according to the present invention makes this simply possible in that all labels present in the system determine their positions mutually. The more labels there are within the transmission range of the transmitting label, the more accurately the positioning of the transmitting label can take place, since the measuring statistics are augmented in this manner. Certainly when there are a great number of labels about within the system, positioning can be carried out with very high accuracy. This accuracy can be used, if so desired, to ease the requirements regarding, for example, the signal strength of the transmitting labels, or to be able to compensate for signal reflection and interference resulting from any obstacles present.

In exceptional situations, for that matter, fewer than three receiving labels may suffice for obtaining a rough estimate of the position of a transmitting label. Positioning is still possible, in principle, on the basis of the positioning data of two receiving labels; in that case, however, it can only be done by compensating for the lacking positioning data by supplementing the data with other data or by making an assumption. One of the assumptions that can be made is that the positions of animals are within a specific height from the floor: the animals may be standing, lying or sitting, and are not all equally tall, so there is a certain range in height from the floor within which all labels must be present. Another assumption may be that the animals must in any case be inside the barn. On the ground of such assumptions the position of each label can be determined on the basis of positioning data of two receiving labels, albeit with some (acceptable) uncertainty.

In embodiments of the system, in use, a plurality of the labels are fixedly disposed and thus function as beacons, with the absolute positions of each label of the plurality of fixedly disposed labels being known within the system, while the system is configured to determine for at least two of the labels, on the basis of the beacon signals of the fixedly disposed labels received by the at least two labels, a position of each of the at least two labels relative to the fixedly disposed labels. While in the above embodiments the mutual distances between the labels and hence their relative positions with respect to each other can be properly determined, information regarding the position of at least two labels is necessary to be able to determine the positions of the other labels in an absolute sense as well. To this end, the system according to these embodiments may yet make use of a few fixed beacons whose absolute position is fixed and is known in the system. However, the fixed beacons do not need to comply with the stringent requirements that beacons in conventional systems have to comply with. In principle, a beacon provided with a transmitter as is also present in the labels suffices. As has already been discussed above, therefore, in some embodiments the beacons can be formed by labels whose position is known in the system. These labels whose absolute positions are known can likewise receive and process the transmitted signals from the other labels, to be able to establish the positions of all other labels. That is why the computer, according to some embodiments, is configured for, on the basis of the calculated relative positions of the labels relative to each other and the determined position of the at least two labels relative to the beacons, determining the relative positions of the labels relative to the beacons, while the information about the relative positions of the labels together with the associated identification codes exported by the computer comprises the relative positions of the labels relative to the beacons.

In some embodiments of the system, the system comprises a transmitter for transmitting label-specific synchronization signals, and wherein the system is configured for closing an oscillator circuit of a specific label upon reception of a synchronization signal specific for that label by the transmitting and receiving device. A transmitted label-specific synchronization signal hence selectively opens an oscillator circuit of a single target label within the system, while the other labels within the system can remain "silent", i.e., transmit no beacon signal. What can be controlled in this way is that only a single label transmits its beacon signal, whereupon the other labels within the system can "listen" in order to receive the beacon signal from the target label, and to determine on the basis of the received beacon signal a relative distance with respect to the target label. The synchronization signals may have been transmitted by a dedicated transmitter, but it is also possible for one or more of the labels to be configured for producing the synchronization signals. For example, a label may be configured to produce a label-specific synchronization signal upon instruction from the system, or, for example, upon request of a neighboring label which has received a label-specific synchronization signal less recently. Also, in an embodiment in which one or more labels are used as fixed beacons, these labels may be configured to produce the label-specific synchronization signals.

According to some embodiments, the system is configured for opening on oscillator circuit of a specific label upon non-reception of the label-specific synchronization signal by the transmitting and receiving device of the specific label. In this way, the oscillator circuit of a specific label can be opened by means of the label-specific synchronization signal upon elapse of the predetermined transmission duration of at least one and at least a whole number of oscillation periods of the electric oscillator signal. In this way, the label-specific synchronization signal therefore controls the (length of) time that the oscillator circuit of a specific target label is closed. With the label-specific synchronization signals the transmission duration of the labels can be controlled individually within the system.

In some embodiments of the system, the transmitter is configured for sequentially transmitting label-specific signals. Thus, a plurality of the labels within the system can be controlled individually and successively to transmit a beacon signal while the other labels within the system listen for determining their relative distance to the transmitting beacon, for example on the basis of the received signal strength of the transmitted beacon signal.

According to some embodiments, the system is configured such that the labels respectively, one after another, transmit a beacon signal during one or more transmission periods. For example, in accordance with some implementations of the system, each label is provided with an electronic clock, with the clocks of the labels mutually synchronized and with the transmission period divided into timeslots, while each of the labels has been assigned a unique timeslot within the, or each, transmission period for transmitting the beacon signal. Each label is then identifiable in the system, for example on the basis of the timeslot in which the label sent the beacon signal. According to a specific embodiment, each label is for instance provided with an electronic clock, with the clocks of the labels mutually synchronized and with the labels, on the basis of signals generated by the clocks, transmitting respectively, one after another, the beacon signal. The labels, in this way, are independently able to determine the proper timeslot within which the beacon signal is to be transmitted. According to some embodiments, the labels receive a synchronization signal periodically and at the start of each time slot, and the labels merely need to count the received synchronization signals to be able to determine when the time slot assigned to the respective label commences. Other embodiments make use, for example, of both a clock and the synchronization signal, for example when a synchronization signal is sent once per series of times slots, and the time slots are thereafter monitored by the label with the aid of an internal clock.

Synchronization can take place in various manners. For example, in some systems, the labels can be synchronized once at initialization of a system, or periodically, for example at charging of a label in a charging station. Synchronization can take place, for example, every minute, five minutes, ten minutes or fifteen minutes. Also, it is possible that each time slot is preceded by a synchronization signal, and where it may or may not be that, for example, the first synchronization signal is specifically recognizable for the label to indicate the start of a series of time slots. Also, use can be made of the received beacon signals of other labels, for example to verify an internal count of time slots in the label, in order to identify the current time slot for the label.

In embodiments of the system, the electric oscillator circuit of each label comprises a field-effect transistor for closing the electric oscillator circuit upon energization of a gate of the field-effect transistor, and for opening the electric oscillator circuit upon non-energization of the gate, and wherein the system is configured for energizing the gate with a label-specific synchronization signal. The duration of a label-specific synchronization signal consequently determines the transmission duration of a specific label, which can be accurately timed in this manner so that the transmission duration corresponds to at least one and at least a whole number of oscillation periods of the electric oscillator signal. With a field-effect transistor, opening and closing of the oscillator circuit can be accurately controlled. With field-effect transistors, losses in the oscillator circuit are thereby kept limited, especially because the opening and closing of the gate can be effected with low voltages, and the electrical conductivity between the terminals is relatively high (for example, an electrical resistance of 1 mΩ).

In some embodiments of the system, each label comprises an amplifier for amplifying a received label-specific synchronization signal for energizing the gate of the field-effect transistor. This is especially advantageous when the synchronization signal is received over a relatively great distance by a label, and the strength of the synchronization signal is too low to energize the gate of the field-effect transistor.

In further embodiments of the system, each label is configured for producing a label-specific synchronization signal. Each label within the system can, as a result, start up another label within the system to transmit a beacon signal. When a specific label has transmitted a beacon signal during the predetermined transmission duration, it can thereupon produce a next label-specific synchronization signal for starting up a next specific label to transmit a beacon signal.

The invention will be discussed below on the basis of specific embodiments thereof not intended as limiting, with reference to the appended figures, in which:

DETAILED DESCRIPTION

Figure 1:
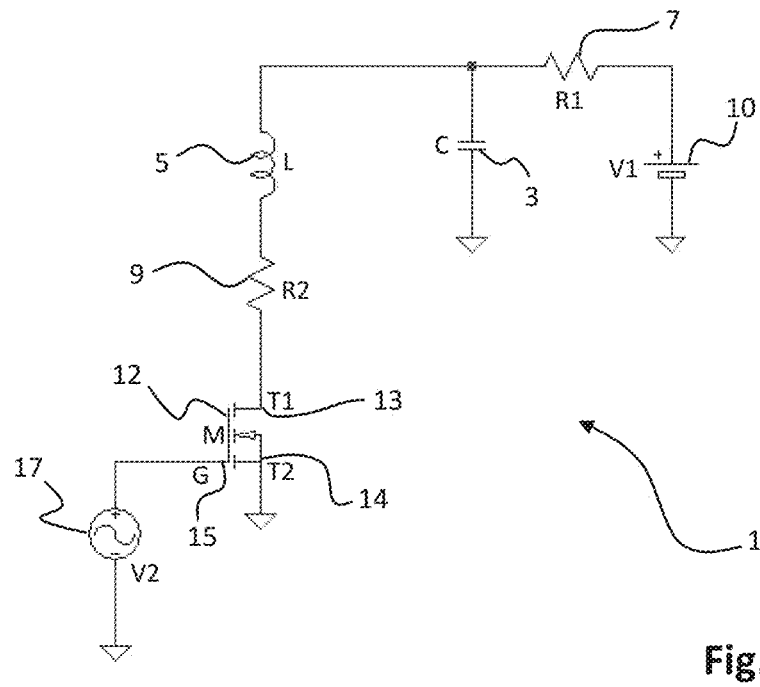
FIG. 1 is a schematic representation of an oscillator circuit of a label.

Shown in FIG. 1 is a schematic representation of an oscillator circuit of a label according to an illustrative example of the invention. The oscillator circuit of FIG. 1 is an LC circuit 1, in particular an RLC circuit, comprising a capacitor 3 (3 (C)), a coil 5 (L), and a resistor 7 (R1). A loss resistance 9 (R2) is represented as an internal electrical resistance of the LC circuit. The capacitor 3 (3 (C)) and coil 5 (L) are connected in parallel, whereby the capacitor 3 (3 (C)) is charged, via resistor 7 (R1), by an energy source 10 (V1). The energy source is a voltage source which provides a direct voltage of, for example, 10 volts. Alternatively, the capacitor 3 (3 (C)) may be coupled via a switch or, for example, a field-effect transistor, to the supply source for charging of capacitor 3 (3 (C)). The energy source 10 (V1) is in particular a direct voltage source such as a battery, more particularly a button cell battery.

The oscillator circuit can be closed and opened by means of a field-effect transistor 12 (M) or, abbreviated, FET. Upon energization of a gate 15 (G) of the field-effect transistor 12 (M), the resistance between terminals 13 (T1) and 14 (T2) of the field-effect transistor 12 (M) is lowered such that the oscillator circuit is closed. Closure of the oscillator circuit has as a result that electric energy in the oscillator circuit is exchanged between electric field energy in the capacitor 3 (C) and magnetic field energy in the coil 5 (L). More particularly, upon closure of the oscillator circuit, the capacitor 3 (C) is short-circuited with the coil 5 (L) as a result of which the capacitor 3 (C) can discharge and a current starts to run through the coil 5 (L). The current in the coil 5 (L) generates a magnetic field around the coil 5 (L). The voltage across the capacitor 3 (C) will decrease in time and will become nil in due course. The current, however, will be maintained by the magnetic field of the coil 5 (L), as a result of which the capacitor 3 (C) is charged anew with a voltage of opposite polarity with respect to an initial voltage. When the magnetic field is completely exhausted, the current through the coil will stop, and the charge is once again stored in the capacitor. After this, the capacitor 3 (C) will discharge anew, as a result of which a current starts to run in opposite direction to that above. Via the magnetic field of the coil 5 (L), the capacitor will be charged in a similar manner: with this, a single oscillation period is completed. By opening the circuit at the moment that at least one and at least a whole number of oscillation periods have been completed, that is, at the moment that the capacitor has been charged to a maximum, a greatest possible part of the electric energy in the oscillator circuit is preserved. Losses as a result of opening the oscillator circuit can thereby be limited.

Due to the internal loss resistance 9 (R2) in the oscillator circuit, however, a part of the electric energy is dissipated as schematically represented with resistor 9 (R2) in FIG. 1. Also, a part of the electric energy is consumed for transmitting an electromagnetic beacon signal. The supply source (V1) consequently needs to recharge the capacitor 3 (CC) only in accordance with the loss and consumption in the circuit. With the size of resistor 7 (R1), inter alia the bandwidth of the oscillator circuit can be determined.

Figure 2:
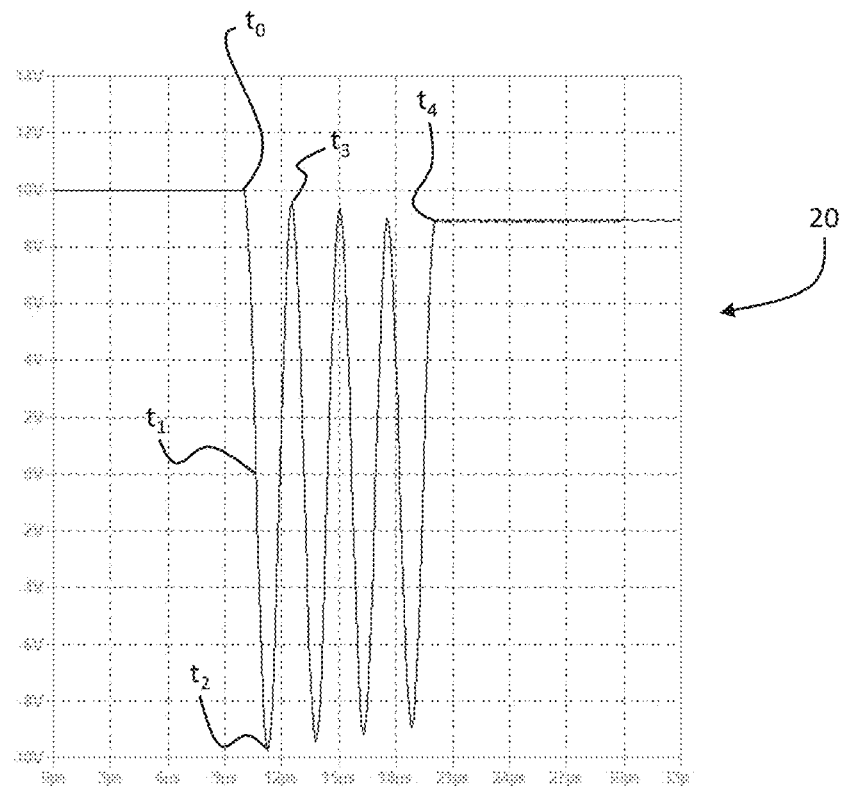
FIG. 2 is a schematic representation of a periodic electric oscillator signal generated in the oscillator circuit upon closure of the oscillator circuit.

FIG. 2 shows a diagram 20 of the voltage across the capacitor 3 (C) in time, in the oscillator circuit. At time t0, the capacitor 3 (C) is charged to a maximum, and the voltage across the capacitor 3 (C) is equal to the supply voltage, in this example +10 volts, but it is equally possible to use a different supply voltage. At time t0 the oscillator circuit is closed, for example as a result of reception of a synchronization signal by the label. The closure of the oscillator circuit creates an electrically conductive current circuit between the capacitor 3 (C) and the coil 5 (L) so that the capacitor 3 (C) discharges, and as a result a current starts to run through the coil 5 (L). The voltage across the capacitor 3 (C) decreases in time until at time t1 the voltage is zero volts. Due to the magnetic field in the coil 5 (L), however, a current will continue to run in the current circuit, as a result of which the capacitor is charged with a voltage of opposite polarity, until at time t2 the voltage across the capacitor is −9.9 volts. The absolute potential difference between t0 and t3 of 0.1 volts is for instance caused by losses in the oscillator circuit, such as the internal resistance of the circuit that dissipates a part of the electric energy in the oscillator circuit. At time t2 the current through the coil 5 (L) is zero amperes, and the capacitor 3 (C) is charged to a maximum, whereupon the capacitor can discharge once again. From time t2, the capacitor discharges and recharges via (the magnetic field of) the coil 5 (L), whereby the capacitor 3 (C) at time t3 is maximally recharged again to 9.8 volts, and the voltage has a same polarity and amplitude as in the initial state of time t0. The generated oscillation signal as shown in FIG. 2 has an oscillation frequency of 400 kHz. Such an oscillation frequency corresponds to an oscillation period of 2.5 microseconds. An oscillation period is hence given, by way of example, from t0 to t3. This oscillation period is traversed four times, whereupon the oscillator circuit is interrupted at time t4. The transmission duration of the label has accordingly been ten microseconds. The oscillator circuit can be closed by the field-effect transistor, for example upon reception of a synchronization signal, whereby the synchronization signal energizes the gate 15 (G) of the field-effect transistor 12 (M). For illustration, in FIG. 1 the gate 15 (G) is connected to voltage source 17 (V2). With the synchronization signal, therefore, the transmission duration of the label can be controlled. For instance, by transmitting the synchronization signal for ten seconds in accordance with four oscillation periods of the oscillator circuit of a label, the oscillator circuit is interrupted at time t4 precisely at the moment when the capacitor 3 (C) is maximally (positively) charged to approximately +9 volts, so that as much charge, and hence electric energy, as possible is preserved in the oscillator circuit. The supply source 10 (V1), as a result, only needs to recharge a difference of about 1 volt, to bring the voltage of the capacitor back to +10 volts. According to the illustrative example of the invention, the oscillator circuit could also be opened after k oscillation periods where k is a whole number greater than zero, for example, after k=1, 2, 3, 4, 5, 6 or 7 oscillation periods. To this end, in the example of FIG. 2, a synchronization signal may be transmitted for 2.5*k microseconds to close the oscillator circuit for 2.5*k microseconds.

Figure 3:
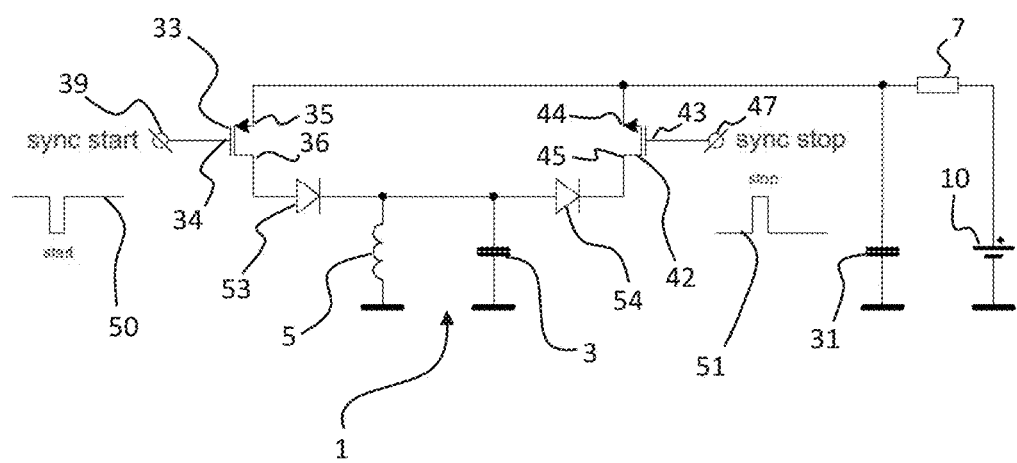
FIG. 3 is a schematic representation of a further embodiment of an oscillator circuit of a label.

FIG. 3 shows a further embodiment, in which an oscillator circuit formed by LC circuit 1, comprising capacitor 3 and coil 5, is configured for, upon closure of the oscillator circuit 1, generating a periodic electric oscillator signal with an oscillation period. Similarly to the embodiment shown in FIG. 1, the oscillator circuit in FIG. 3 can be used in a transmitting and receiving device, for transmitting an electromagnetic beacon signal with the transmitting and receiving device. Closing and opening of the oscillator circuit is done through suitably activating and deactivating transistors 33 and 42, as further explained below. The oscillator circuit 1 can be activated for a predetermined time duration, and after that can be deactivated for releasing the electric energy and storing same in buffer capacitor 31. The predetermined time duration can then be determined so as to correspond to half an oscillation period, or half an oscillation period plus thereupon a whole number of oscillation periods of the electric oscillator signal in oscillator circuit 1, for preserving the electric energy in the buffer capacitor 31 of the circuit.

In the circuit of FIG. 3, the above can be achieved by presenting to the inputs 39 and 47, at suitably chosen times, a synchronization signal 50 or 51 (sync start/sync stop) for respectively operating the gates 34 and 43 of two field-effect transistors 33 and 42. For instance, by presenting a first negative voltage pulse 50 to the gate 34 of transistor 33, the transistor 333 switches into conduction and a current will flow from buffer capacitor 31 to the LC circuit 1. The diodes 53 and 54 then ensure that the current can run only in the direction to the left, so via transistor 33, to the LC circuit 1. Coil 5 retains this received current as a result of self-induction, and via the interaction with capacitor 3 arises the desired oscillator signal after switching off of transistor 33.

According to the illustrative example of the invention, the oscillator circuit 1 is deactivated after exactly half an oscillation period, or half an oscillation period plus k oscillation periods where k is a whole number greater than zero. Exactly is here understood to mean that the moment of opening is chosen as optimally as possible in agreement with the moment at which a maximum current is attained in the LC circuit, so that with this current the buffer capacitor 31 is charged again. Deactivating the oscillator circuit is done by energization of the gate 43 of field-effect transistor 42, so that via the diode 54, and the terminals 45 and 44 of transistor 42 the current in the LC circuit 1 flows back to buffer capacitor 31. The gate 43 of transistor 42 is here energized via the sync stop signal 51, a positive voltage pulse. The design as drawn is such that the principle of the illustrative examples provided of the invention can be understood. For practical reasons, the actual design may be different than as drawn in FIG. 3. The illustrative example circuit of FIG. 3 is somewhat more extensive than the circuit of FIG. 1, but provides a number of advantages. The voltage across the coil 5 in this situation can become 50 times greater than in the embodiment of FIG. 1, as a result of which the coil value can be 2500 times greater and the value of the capacitor 2500 times smaller. These values can accordingly be more simply brought within a more practical range. Also the circulating current becomes 50 times smaller, as a result of which resistance in the circuit has 2500 times less effect on the quality. The capacitive value of buffer capacitor 31 is significantly greater than the capacitive value of resonance capacitor 3, but that is practically no problem. Additional advantage is that the switching losses in this embodiment remain limited, so that the circuit provides a high efficiency.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventor expects skilled artisans to employ such variations as appropriate, and the inventor intends for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A label for attachment to an animal, provided with a transmitting and receiving device comprising an electric oscillator circuit configured for, upon closure of the electric oscillator circuit, generating a periodic electric oscillator signal with an oscillation period for transmitting an electromagnetic beacon signal with the transmitting and receiving device,
    wherein the label is configured for closing the electric oscillator circuit during a predetermined transmission duration, and is configured for opening the electric oscillator circuit upon elapse of the predetermined transmission duration,
    wherein the predetermined transmission duration corresponds to at least one and at least a whole number of oscillation periods of the periodic electric oscillator signal for preserving electric energy in the oscillator circuit,
    wherein the label is configured for transmitting, by the transmitting and receiving device, an electromagnetic beacon signal comprising an identification code of the respective label, and
    wherein the label is configured for receiving, by the transmitting and receiving device, an electromagnetic beacon signal that has been transmitted by another label.

2. The label according to claim 1, wherein the oscillator circuit comprises an LC (inductor-capacitor) circuit with at least a capacitor and a coil, and
    wherein, upon closure of the oscillator circuit, the capacitor is discharged for producing the periodic oscillator signal.

3. The label according to claim 2, wherein a supply source is provided for charging the capacitor.

4. The label according to claim 1, wherein the electric oscillator circuit comprises a transistor for opening and closing the electric oscillator circuit.

5. The label according to claim 1, wherein the label is configured for receiving a synchronization signal with the transmitting and receiving device, and
    wherein the label is configured for closing the electric oscillator circuit upon reception of the synchronization signal.

6. The label according to claim 5, wherein the label is configured for opening the electric oscillator circuit upon non-reception of the synchronization signal.

7. The label according to claim 1, wherein the electric oscillator circuit is configured for, upon closure of the oscillator circuit, generating a periodic electric oscillator signal with an oscillation frequency of less than 1000 kHz.

8. The label according to claim 1, wherein the at least one and whole number is in the range of 2-6 oscillation periods.

9. The label according to claim 1, wherein each label is configured for, with the aid of a processor, determining positioning data, and wherein the positioning data comprises position data, or is based on, at least one of the group consisting of:
    information about the signal strength of a beacon signal received with that label;
    information about the signal strength with which the beacon signal was transmitted; and
    information about a time at which the beacon signal was received.

10. The label according to claim 1, wherein the label is configured to transmit, by the transmitting and receiving device, information about the positioning data determined by a processor of that label and the associated identification code.

11. A system, comprising a plurality of labels each label being for attachment to an animal, and wherein each one of the plurality of labels is provided with a transmitting and receiving device comprising an electric oscillator circuit configured for, upon closure of the electric oscillator circuit, generating a periodic electric oscillator signal with an oscillation period for transmitting an electromagnetic beacon signal with the transmitting and receiving device,
 wherein the label is configured for closing the electric oscillator circuit during a predetermined transmission duration, and is configured for opening the electric oscillator circuit upon elapse of the predetermined transmission duration,
 wherein the predetermined transmission duration corresponds to at least one and at least a whole number of oscillation periods of the periodic electric oscillator signal for preserving electric energy in the oscillator circuit,
 wherein each label is configured for receiving with the transmitting and receiving device an electromagnetic beacon signal which has been transmitted by another label, which electromagnetic beacon signal comprises an identification code of the respective label, and
 wherein each label is configured for, with the aid of a processor of the label, determining positioning data, and wherein each label is configured to transmit with the transmitting and receiving device information about the positioning data determined by the processor of that label and the associated identification code, wherein the system further comprises at least a receiver for receiving the information about the positioning data transmitted by the labels and the associated identification codes, and a computer which is communicatively connected with the receiver and which is configured to calculate, at least on the basis of information about the positioning data received with the receiver and the associated identification codes, the relative positions of the labels relative to each other and to export information about the relative positions of the labels together with the associated identification codes of the labels, in particular in the form of an electric information signal.

12. The system according to claim 11, wherein, in use, a plurality of the labels are fixedly disposed and thus function as beacons, with the absolute positions of each label of the plurality of fixedly disposed labels being known within the system, while the system is configured to determine for at least two of the labels, at least on the basis of the beacon signals of the fixedly disposed labels received by the at least two labels, a position of each of the at least two labels relative to the fixedly disposed labels.

13. The system according to claim 11, wherein the system comprises a transmitter for transmitting label-specific synchronization signals, and
 wherein the system is configured for closing an oscillator circuit of a specific label upon reception of a synchronization signal specific for that label by the transmitting and receiving device.

14. The system according to claim 13, wherein the system is configured for opening an oscillator circuit of a specific label upon non-reception of the label-specific synchronization signal by the transmitting and receiving device of the specific label.

15. The system according to claim 13, wherein the transmitter is configured for sequentially transmitting label-specific signals.

16. The system according to claim 13, wherein the electric oscillator circuit of each label comprises a field-effect transistor for closing the electric oscillator circuit upon energization of a gate of the field-effect transistor, and for opening the electric oscillator circuit upon non-energization of the gate, and
 wherein the system is configured for energizing the gate with a label-specific synchronization signal.

17. The system according to claim 16, wherein each label comprises an amplifier for amplifying a received label-specific synchronization signal for energizing the gate of the field-effect transistor.

18. The system according to claim 13, wherein each label is configured for producing a label-specific synchronization signal.

19. A label for attachment to an animal, provided with a transmitting and receiving device comprising an electric oscillator circuit configured for, upon activation of the electric oscillator circuit, generating a periodic electric oscillator signal with an oscillation period for transmitting an electromagnetic beacon signal with the transmitting and receiving device,
 wherein the label is configured for activating the electric oscillator circuit during a predetermined transmission duration, and is configured for deactivating the electric oscillator circuit upon elapse of the predetermined transmission duration, and
 wherein the predetermined transmission duration corresponds to a half an oscillation period, or to a half an oscillation period increased by at least a whole number of oscillation periods of the periodic electric oscillator signal for preserving electric energy in the oscillator circuit.

20. The label according to claim 19, wherein the oscillator circuit comprises an LC (inductor-capacitor) circuit with at least a capacitor and a coil, and
 wherein, upon closure of the oscillator circuit, the capacitor is discharged for producing the periodic oscillator signal.

21. The label according to claim 19, wherein the electric oscillator circuit, through at least one diode, at least one resistor and at least one conducting path, is connected with a buffer capacitor, for preserving the electric energy in the buffer capacitor outside the transmission duration.

* * * * *